US012573580B2

(12) United States Patent
La Fontaine et al.

(10) Patent No.: US 12,573,580 B2
(45) Date of Patent: Mar. 10, 2026

(54) SYSTEM AND APPARATUS FOR STABILIZING ELECTRON SOURCES IN CHARGED PARTICLE SYSTEMS

(71) Applicant: ASML Netherlands B.V., Veldhoven (NL)

(72) Inventors: Bruno La Fontaine, Pleasanton, CA (US); Juying Dou, San Jose, CA (US); Zhidong Du, San Jose, CA (US); Che-Chia Kuo, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 35 days.

(21) Appl. No.: 18/580,152

(22) PCT Filed: Jun. 23, 2022

(86) PCT No.: PCT/EP2022/067096

§ 371 (c)(1),
(2) Date: Jan. 18, 2024

(87) PCT Pub. No.: WO2023/001480

PCT Pub. Date: Jan. 26, 2023

(65) Prior Publication Data

US 2024/0347311 A1     Oct. 17, 2024

Related U.S. Application Data

(60) Provisional application No. 63/224,789, filed on Jul. 22, 2021.

(51) Int. Cl.
*H01J 37/065*     (2006.01)

(52) U.S. Cl.
CPC ... *H01J 37/065* (2013.01); *H01J 2237/06375* (2013.01)

(58) Field of Classification Search
CPC ........... H01J 37/065; H01J 2237/06375; H01J 2237/0216; H01J 37/06; H01J 1/18
See application file for complete search history.

(56) References Cited

U.S. PATENT DOCUMENTS 4,068,145 A * 1/1978 Nakagawa .............. H01J 29/04
                                                           313/341
4,924,136 A * 5/1990 Lischke .................. H01J 37/07
                                                           313/292

(Continued)

FOREIGN PATENT DOCUMENTS

DE          2944083 C2 * 9/1987
JP       S52 146963 U    11/1977

(Continued)

OTHER PUBLICATIONS

PCT International Search Report issued in related PCT Application No. PCT/EP2022/067096, mailed Oct. 17, 2022 (3 pgs.).

*Primary Examiner* — Tracie Y Green

(74) *Attorney, Agent, or Firm* — FINNEGAN, HENDERSON, FARABOW, GARRETT & DUNNER, LLP

(57) ABSTRACT

Apparatuses and systems for stabilizing electron sources in charged particle beam inspection systems are provided. In some embodiments, a system may include an electron source comprising an emitting tip electrically connected to two electrodes and configured to emit an electron; and a base coupled to the emitting tip, wherein the base is configured to stabilize the emitting tip via the coupling.

18 Claims, 6 Drawing Sheets

(56) References Cited

U.S. PATENT DOCUMENTS

| | | | |
|---|---|---|---|
| 8,896,195 B2 | 11/2014 | Dou | |
| 9,754,764 B2 | 9/2017 | Straw et al. | |
| 10,784,071 B2 * | 9/2020 | Dou | H01J 37/065 |
| 2006/0226753 A1 | 10/2006 | Adamec et al. | |
| 2010/0019649 A1 * | 1/2010 | Terui | B82Y 40/00 |
| | | | 313/446 |
| 2010/0090581 A1 | 4/2010 | Terui et al. | |
| 2012/0098409 A1 * | 4/2012 | Dou | H01J 37/065 |
| | | | 313/341 |
| 2014/0299768 A1 | 10/2014 | Shichi et al. | |
| 2020/0234907 A1 | 7/2020 | Asulin et al. | |
| 2022/0293387 A1 * | 9/2022 | Liu | H01J 1/3044 |

FOREIGN PATENT DOCUMENTS

| | | | |
|---|---|---|---|
| JP | S55 109343 A | 8/1980 | |
| TW | 202046018 A | 12/2020 | |

* cited by examiner

300

400

SYSTEM AND APPARATUS FOR STABILIZING ELECTRON SOURCES IN CHARGED PARTICLE SYSTEMS

CROSS-REFERENCE TO RELATED APPLICATIONS

This application is a national stage filing under 35 U.S.C. § 371 of International Application No. PCT/EP2022/067096, filed Jun. 23, 2022, and published as WO 2023/001480 A1, which claims priority of U.S. application 63/224,789, filed on 22 Jul. 2021, both of which are incorporated herein by reference in their entireties.

FIELD

The description herein relates to the field of charged particle beam systems, and more particularly to systems for stabilizing electron sources in charged particle beam inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments of the present disclosure provide apparatuses and systems for stabilizing electron sources in charged particle beam inspection systems. In some embodiments, a system may include an electron source comprising an emitting tip electrically connected to two electrodes and configured to emit an electron; and a base coupled to the emitting tip, wherein the base is configured to stabilize the emitting tip via the coupling.

In some embodiments, an electron source may include an emitting tip electrically connected to two electrodes and configured to emit an electron; and a base coupled to the emitting tip, wherein the base is configured to stabilize the emitting tip via the coupling.

In some embodiments, a system may include an electron source comprising an emitting tip electrically connected to two electrodes and configured to emit an electron; and a base comprising a hole; and a plurality of extensions extending toward a center of the hole, wherein the plurality of extensions are coupled to the emitting tip, wherein the base is configured to stabilize the emitting tip via the coupling.

In some embodiments, a system may include an electron source comprising an emitting tip coupled to two filament prongs, wherein the emitting tip and the two filament prongs form a "W" shape, each filament prong of the two filament prongs is coupled to an electrode, and the emitting tip is configured to emit an electron; and a base coupled to the emitting tip, wherein the base is configured to stabilize the emitting tip via the coupling.

DETAILED DESCRIPTION

Figure 1:
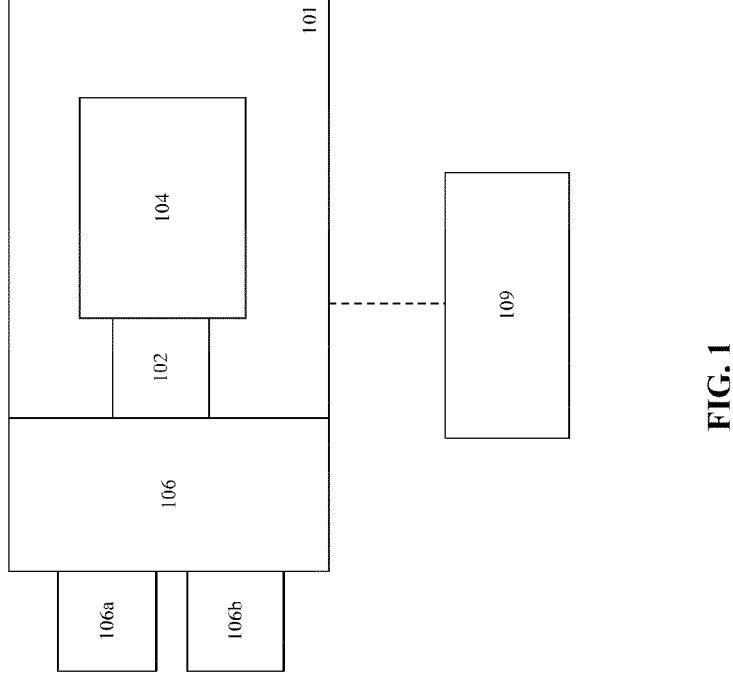
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, extreme ultraviolet inspection, deep ultraviolet inspection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $1/1000$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur. Defects may be generated during various stages of semiconductor processing. For the reason stated above, it is important to find defects accurately and efficiently as early as possible.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

During inspection, the filament (e.g., an emitting tip of the filament) of the electron source typically vibrates during operation of a SEM. Since the electrons provided by the electron source are used to image samples during inspection, in typical charged particle systems, the vibration of the emitting tip may negatively affect the SEM images (e.g., by causing oscillations in gray scale levels in images, oscillations in gray scale levels at edges of sharp objects in images, oscillations in gray scale levels at lithographically-defined lines in images, inaccurate or varying gray scale levels across images, low critical dimension stability, poor image quality, etc.).

The negative effects on the SEM images in typical charged particle systems may be exacerbated when the electron source operates at a high current (e.g., using a high-brightness electron source, to achieve high magnification between the electron source and the sample, to achieve high resolution images, etc.). To achieve higher quality images, it is helpful to mitigate the negative effects of the emitting tip vibration, especially as the critical dimensions of devices or objects on samples inspected by a SEM decrease in size.

Some of the disclosed embodiments provide systems and apparatuses that address some or all of these disadvantages by stabilizing an electron source. Some disclosed embodiments may provide systems and apparatuses that stabilize an electron source by providing an electron source base that is configured to reduce thermal contact with an emitting tip of the electron source and reduce vibrations of the emitting tip, thereby advantageously providing higher quality samples and images (e.g., reducing oscillations in gray scale levels in images, reducing oscillations in gray scale levels at edges of sharp objects in images, reducing oscillations in gray scale levels at lithographically-defined lines in images, reducing inaccurate or varying gray scale levels across images, increasing critical dimension stability, improving repeatability in samples and images, etc.).

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port (s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
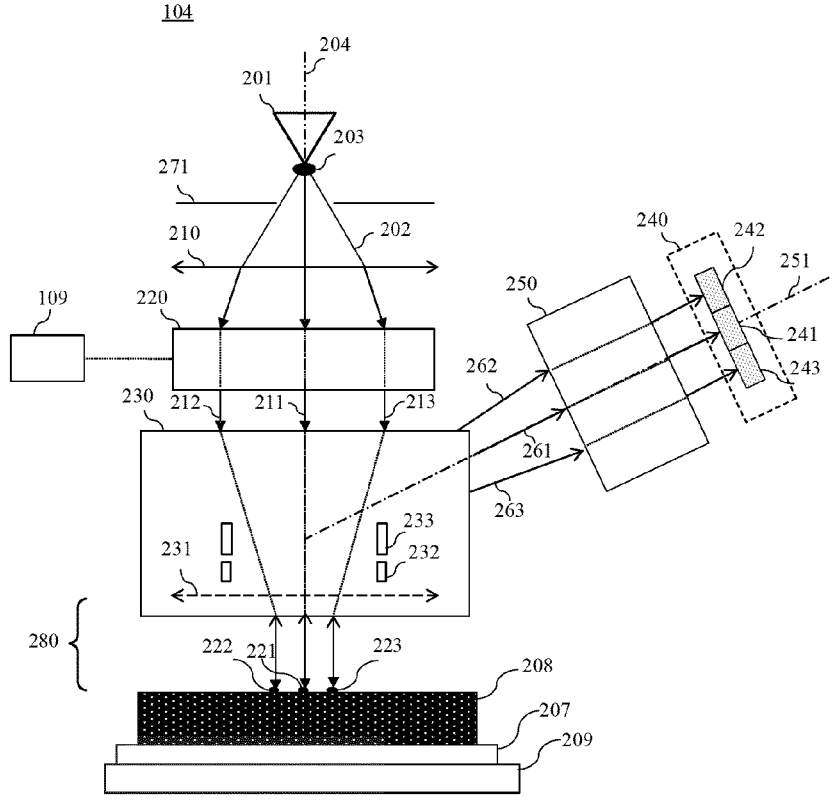
FIG. 2 is a schematic diagram illustrating an exemplary electron beam tool that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104. In some embodiments, apparatus 104 may be a SEM used for lithography. In some embodiments, electron beam tool 104 may be a single-beam system or a multi-beam system.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries. adapting to different throughputs and resolution requirements.

Figure 3:
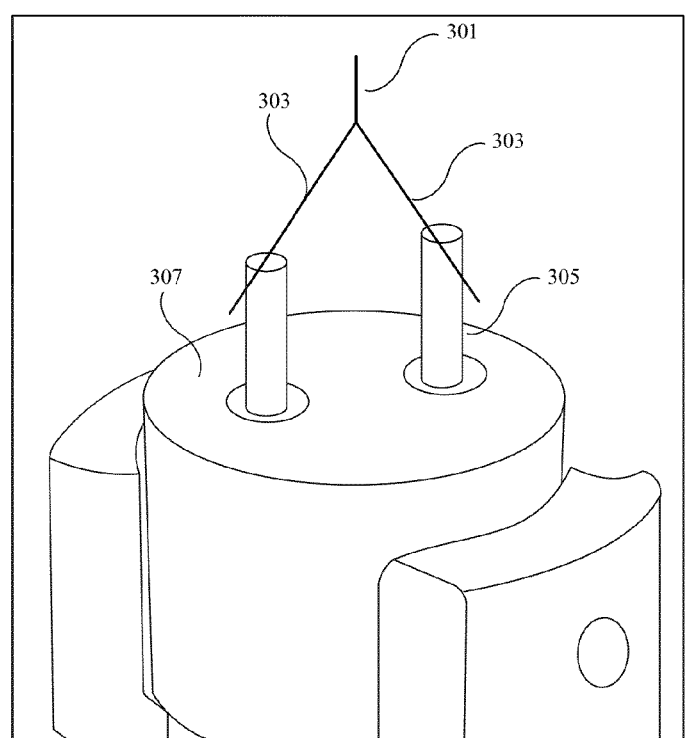
FIG. 3 is a schematic diagram illustrating an exemplary electron source.

FIG. 3 illustrates a schematic diagram illustrating an exemplary electron source 300 including a "Y" shaped filament emitting component. In an electron beam tool (e.g., electron beam tool 104 of FIG. 2), electron source 300 may include a filament including a filament emitting tip 301 and filament prongs 303. Electron source 300 may include electrodes 305 and a base 307. Electron source 300 may emit electrons via current that runs through electrodes 305, and filament prongs 303, thereby resistively heating filament emitting tip 301.

During typical inspections, filament emitting tip 301 vibrates during operation of a SEM. The vibration of filament emitting tip 301 may negatively affect the SEM images (e.g., oscillations in gray scale levels in images, oscillations in gray scale levels at edges of sharp objects in images, oscillations in gray scale levels at lithographically-defined lines in images, inaccurate or varying gray scale levels across images, low critical dimension stability, poor image quality, etc.).

The negative effects on the SEM images in typical charged particle systems may be exacerbated when electron source 300 operates at a higher current (e.g., using a higher-brightness electron source, to achieve higher magnification between the electron source and the sample, to achieve higher resolution images, etc.).

For example, vibrations from the electron beam system coupled to the filament emitting tip 301 and base 307 during inspection may cause base 307 and filament emitting tip 301 to vibrate, thereby resulting in lower quality images.

Figure 4:
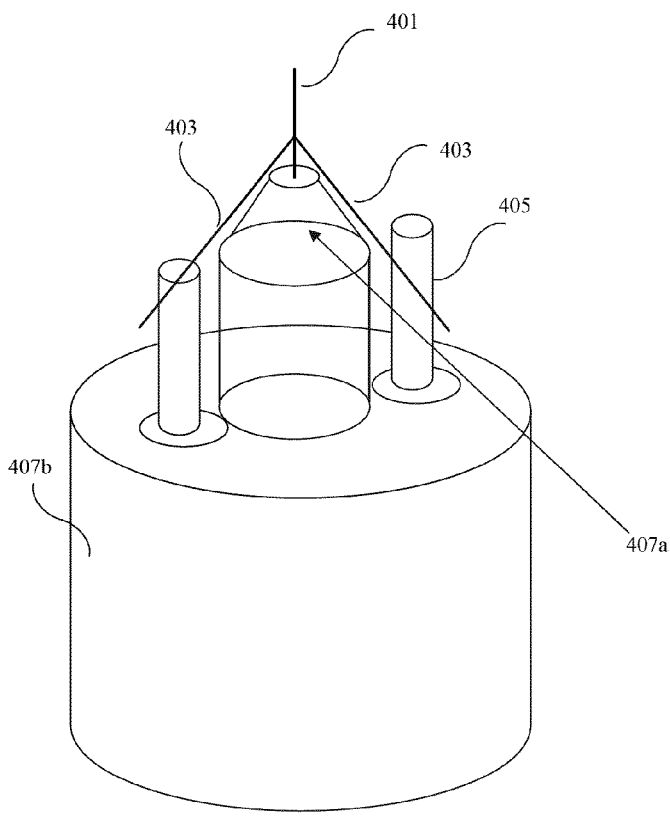
FIG. 4 is a schematic diagram illustrating an exemplary electron source that is part of the exemplary electron beam tool of FIG. 2, consistent with embodiments of the present disclosure.

FIG. 4 illustrates a schematic diagram illustrating an exemplary electron source 400, including a "W" shaped filament emitting component, that is part of the exemplary electron beam tool of FIG. 2, consistent with embodiments of the present disclosure.

In an electron beam tool (e.g., electron beam tool 104 of FIG. 2), electron source 400 (e.g., electron source 201 of FIG. 2, electron source 500 of FIG. 5, or electron source 600 of FIG. 6) may include a filament including a filament emitting tip 401 and filament prongs 403. Electron source 400 may include one or more electrodes 405 and a base including an upper portion 407a and a lower portion 407b. Electron source 400 may emit one or more electrons via current that runs through electrodes 405, and filament prongs 403, thereby resistively heating filament emitting tip 401. That is, filament emitting tip 401 may be electrically connected to electrodes 405. In some embodiments, filament emitting tip 401 and filament prongs 403 may be made of tungsten.

When attached to a spring, an object's natural frequency is the frequency or rate that it vibrates naturally when disturbed. An object's natural frequency depends on the mass of the object and the stiffness of the spring, which may be described by the following formula:

$$\omega = \sqrt{\frac{k}{m}} \qquad (1)$$

where $\omega$ is the object's natural frequency, k is the spring constant (e.g., spring stiffness), and m is the mass of the object. A spring that is stiffer has a higher spring constant, k.

The displacement of an object from equilibrium during oscillation (e.g., when an object vibrates) is called the amplitude. The energy of oscillation may be described by the following formula:

$$E = \frac{1}{2} k \cdot A^2 = \frac{1}{2} m \cdot A^2 \cdot \omega^2 \qquad (2)$$

where E is the energy of an object during oscillation, A is the amplitude of the object, k is the spring constant of the object, and w is the object's natural frequency.

In some embodiments, upper base portion 407a may be configured to be connected to filament emitting tip 401 and filament prongs 403. In some embodiments, upper base portion 407 may be configured to reduce thermal contact with filament emitting tip 401 or filament prongs 403 and reduce vibrations of filament emitting tip 401 during inspection. For example, upper base portion 407a may include a plurality of tabs (further described below at e.g., plurality of tabs 537 of FIG. 5 or plurality of tabs 637 of FIG. 6) that are configured to contact filament emitting tip 401. Upper base portion 407a may include a holder and an insert that screws into the holder, which are configured to hold the plurality of tabs in contact with filament emitting tip 401, thereby stabilizing filament emitting tip 401 during inspection. In some embodiments, the holder and the insert may not contact filament emitting tip 401. In some embodiments, upper base portion 407a (e.g., including the plurality of tabs, holder, and insert) and lower base portion 407b may be made of non-conductive material (e.g., ceramic such as aluminum oxide, aluminum nitride, etc.).

During typical inspections, the vibration of a filament emitting tip may be described by Equations (1) and (2) above. When upper base portion 407a includes a plurality of tabs that are configured to stabilize filament emitting tip 401, the spring constant of filament emitting tip 401 may be higher than the spring constant of a filament emitting tip (e.g., filament emitting tip 301 of FIG. 3) without the plurality of tabs. As described by Equation (1), the natural frequency of filament emitting tip 401 may be higher than the natural frequency of a filament emitting tip without a plurality of tabs.

Given that filament emitting tip 401 and a filament emitting tip without a plurality of tabs has the same source of energy for mechanical vibrations and that most of this energy goes into fundamental mode, the energy of oscillation of filament emitting tip 401 and the energy of oscillation of a filament emitting tip without a plurality of tabs may be the same during oscillation, which may be described by the following formula:

$$E = \frac{1}{2} k_1 \cdot A_1^2 = \frac{1}{2} k_2 \cdot A_2^2 \qquad (3)$$

where $A_1$ and $k_1$ are the amplitude and spring constant, respectively, of a filament emitting tip without a plurality of tabs and $A_2$ and $k_2$ are the amplitude and spring constant, respectively, of filament emitting tip 401. As described above, the spring constant of filament emitting tip 401, $k_2$, is greater than the spring constant of a filament emitting tip without a plurality of tabs, $k_1$. Therefore, the amplitude (e.g., vibrations) of filament emitting tip 401 may be reduced compared to the amplitude of a filament emitting tip without a plurality of tabs, which may be described by the following formula:

$$A_2 = A_1 \cdot \sqrt{\frac{k_1}{k_2}} \qquad (4)$$

In some embodiments, the length of filament emitting tip 401 or filament prongs 403 may be shorter than typical configurations (e.g., electron source 300 of FIG. 3) since filament emitting tip 401 does not need to rely on filament prongs 403 for support. Therefore, the mass of filament emitting tip 401 may be reduced such that the natural frequency of filament emitting tip 401 may be increased, as described by Equation (1), and the amplitude of filament emitting tip 401 may be reduced. In some embodiments, the reduced length of filament emitting tip 401 or filament prongs 403 may result in resistive heating at a reduced electrical power.

In some embodiments, the plurality of tabs may advantageously stabilize filament emitting tip 401 while reducing thermal contact between filament emitting tip 401 and upper base portion 407a or lower base portion 407b. In some embodiments, the reduction in thermal contact may advantageously allow filament emitting tip 401 to maintain sufficient resistive heating to emit one or more electrons. In some embodiments, as shown in FIG. 4, filament emitting tip 401 and filament prongs 403 may form a "W" shape in electron source 400 such that filament emitting tip 401 relies on upper base portion 407a for support. This "W" configuration may be more stable than the "Y" configuration (e.g., electron source 300 of FIG. 3) since filament emitting tip 401 is stabilized by upper base portion 407a (e.g., by plurality of tabs 537 of FIG. 5) and does not rely on filament prongs 403 for support. This "W" configuration may minimize vibrations of filament emitting tip 401, thereby resulting in higher quality images.

By minimizing thermal contact between filament emitting tip 401 and upper base portion 407a and lower base portion 407b and minimizing vibrations of filament emitting tip 401, electron source 400 may advantageously provide high quality samples and images (e.g., minimizing oscillations in gray scale levels in images, minimizing oscillations in gray scale levels at edges of sharp objects in images, minimizing oscillations in gray scale levels at lithographically-defined lines in images, minimizing inaccurate or varying gray scale levels across images, maximizing critical dimension stability, maintaining repeatability in samples and images, etc.).

Figure 5:
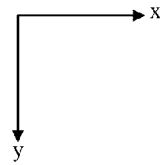
FIG. 5 is a schematic diagram illustrating an exemplary electron source that is part of the exemplary electron beam tool of FIG. 2, consistent with embodiments of the present disclosure.
Figure 5:
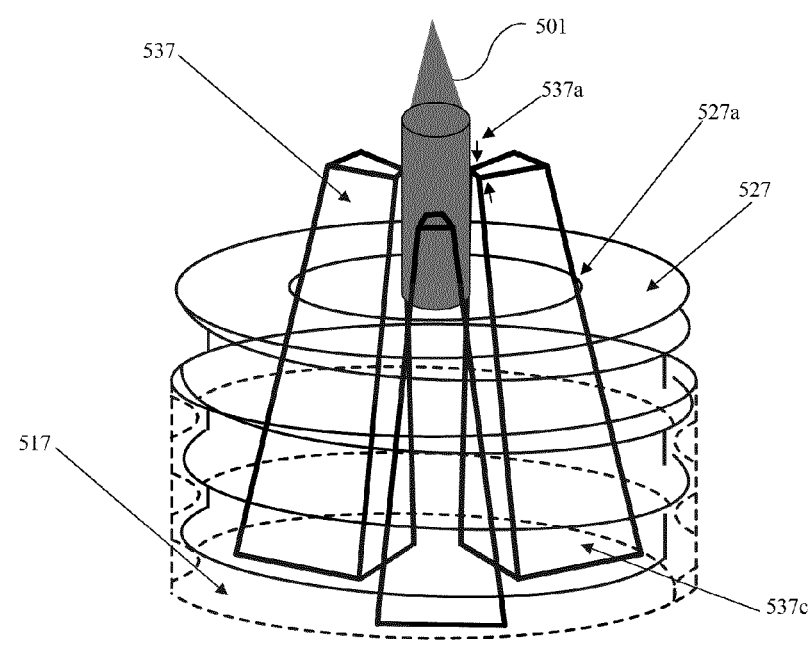

FIG. 5 illustrates a schematic diagram illustrating an exemplary electron source 500 that is part of the exemplary electron beam tool of FIG. 2, consistent with embodiments of the present disclosure. Components of electron source 500 may be part of, or joined to, an upper base portion (e.g., upper base portion 407a of FIG. 4) of an electron source (e.g., electron source 400 of FIG. 4).

In an electron beam tool (e.g., electron beam tool 104 of FIG. 2), electron source 500 (e.g., electron source 201 of FIG. 2, electron source 400 of FIG. 4, or electron source 600 of FIG. 6) may include a filament including a filament emitting tip 501 and filament prongs (e.g., filament prongs 403 of FIG. 4). Electron source 500 may include one or more electrodes (e.g., electrodes 405 of FIG. 4) and a base including an upper portion (e.g., upper base portion 407a of FIG. 4) and a lower portion (e.g., lower base portion 407b of FIG. 4). Electron source 500 may emit one or more electrons via current that runs through one or more electrodes, and filament prongs, thereby resistively heating filament emitting tip 501. That is, filament emitting tip 501 may be electrically connected to one or more electrodes. In some embodiments, filament emitting tip 501 and the filament prongs may be made of tungsten.

In some embodiments, the upper base portion may be configured to be connected to filament emitting tip 501 and the filament prongs. In some embodiments, the upper base portion may be configured to reduce thermal contact with filament emitting tip 501 or the filament prongs and reduce vibrations of filament emitting tip 501 during inspection. For example, the upper base portion may include a plurality of tabs 537 that are configured to contact filament emitting tip 501. While FIG. 5 shows three tabs 537, it is appreciated that any number of tabs may be used. The upper base portion may include a holder 517 and an insert 527 that screws into holder 517, which are configured to hold plurality of tabs 537 in contact with filament emitting tip 501, thereby stabilizing filament emitting tip 501 during inspection. In some embodiments, holder 517 and insert 527 may not contact filament emitting tip 501. In some embodiments, the upper base portion (e.g., including plurality of tabs 537, holder 517, and insert 527) and the lower base portion may be made of non-conductive material (e.g., ceramic).

In some embodiments, the base may be configured to stabilize filament emitting tip 501 via a coupling between the base (e.g., plurality of tabs 537, holder 517, and insert 527) and filament emitting tip 501. This stabilizing may involve not only reducing thermal contact, but also reducing vibrations of the filament emitting tip 501. For example, the upper base portion may be configured to reduce thermal contact between the base and filament emitting tip 501 via plurality of tabs 537, which are configured to contact filament emitting tip 501. In some embodiments, stabilizing filament emitting tip 501 may include reducing thermal contact between filament emitting tip 501 and the base via plurality of tabs 537, which are configured to contact filament emitting tip 501.

The upper base portion may be configured to reduce vibrations of filament emitting tip 501 by increasing a spring constant of filament emitting tip 501. The upper base portion may increase a spring constant of filament emitting tip 501 via plurality of tabs 537, which are configured to contact filament emitting tip 501, thereby increasing the stiffness of filament emitting tip 501. Insert 527 and holder 517 may be configured to hold plurality of tabs 537 in contact with filament emitting tip 501, thereby increasing the stiffness, and the spring constant, of filament emitting tip 501. In some embodiments, stabilizing filament emitting tip 501 may include reducing vibrations of filament emitting tip 501 by increasing a spring constant of filament emitting tip 501.

In some embodiments, the thermal contact between the base and filament emitting tip 501 may be reduced as compared to a thermal contact between a base and a filament emitting tip in an electron source that excludes tabs (e.g., electron source 300 of FIG. 3). In some embodiments, the vibrations of filament emitting tip 501 may be reduced as compared to vibrations of a filament emitting tip in an electron source that excludes tabs (e.g., electron source 300 of FIG. 3).

While depicted as separate components, in some embodiments, holder 517, insert 527, and plurality of tabs 537 may comprise a single, joint structure (e.g., upper base portion 407a of FIG. 4). For example, the upper base portion (e.g., including plurality of tabs 537, holder 517, and insert 527) of electron source 500 may be manufactured by drilling (e.g., laser drilling) a hole 527a (e.g., 100-200 μm in diameter. 250 μm depth with a conical taper at the bottom) in the upper base portion, where hole 527a may hold filament emitting tip 501. In some embodiments, plurality of tabs 537 may be manufactured by laser-machining the hole in the upper base portion. In some embodiments, plurality of tabs 537 may be manufactured to have a width 537*a* (e.g., less than or equal to 1 μm) so that the total contact area between filament emitting tip 501 and the base (e.g., upper base portion 407*a*, lower base portion 407*b* of FIG. 4) is minimized (e.g., 1500 μm²). In some embodiments, this configuration may minimize the heat transfer from filament emitting tip 501 to the base (e.g., including plurality of tabs 537, holder 517, and insert 527).

For example, plurality of tabs 537 may be manufactured such that each tab extends from an inner side of hole 527*a* toward a center of hole 527*a*. In some embodiments, filament emitting tip 501 may be positioned in the center of hole 527*a*.

Figure 6:
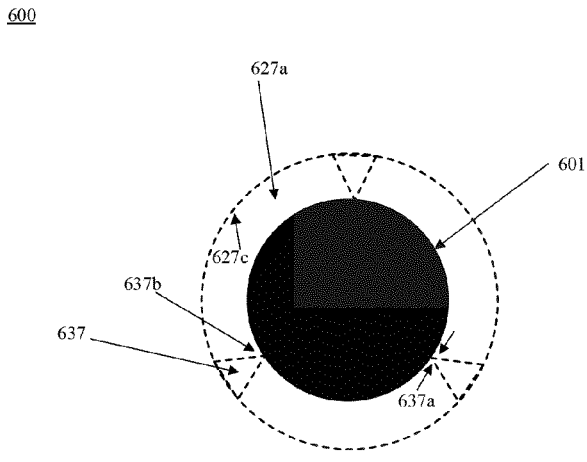
FIG. 6 is a schematic diagram illustrating a top view of an exemplary electron source that is part of the exemplary electron beam tool of FIG. 2, consistent with embodiments of the present disclosure.

In some embodiments, each tab of plurality of tabs 537 may be triangular shaped when viewed from above electron source 500 (e.g., see plurality of tabs 637 of FIG. 6). In some embodiments, each tab of plurality of tabs 537 may be substantially triangular shaped (e.g., some edges of each tab may be curved). In some embodiments, an apex (e.g., apex 637*b* of FIG. 6) may be configured to contact filament emitting tip 501.

In some embodiments, each tab of plurality of tabs 537 may be quadrilateral shaped when viewed from above electron source 500. In some embodiments, each tab of plurality of tabs 537 may be substantially quadrilateral shaped (e.g., some edges of each tab may be curved). In some embodiments, a shortest edge (e.g., an edge with width 537*a*) of each quadrilateral-shaped tab of plurality of tabs 537 may be configured to contact filament emitting tip 501.

In some embodiments, a base 537*c* of each tab of plurality of tabs 537 may extend away from filament emitting tip 501. For example, base 537*c* may extend in a substantially x direction away from filament emitting tip 501 or base 537*c* may extend in a substantially y direction away from filament emitting tip 501. In some embodiments, when viewed in a substantially y direction, a cross-sectional area of base 537*c* of each tab may be greater than a cross-sectional area of a portion of each tab that contacts filament emitting tip 501.

During typical inspections, the vibration of a filament emitting tip may be described by Equations (1) and (2) above. When the upper base portion includes plurality of tabs 537 that are configured to stabilize filament emitting tip 501, the spring constant of filament emitting tip 501 may be higher than the spring constant of a conventional filament emitting tip without plurality of tabs 537. As described by Equation (1), the natural frequency of filament emitting tip 501 may be higher than the natural frequency of a filament emitting tip without a plurality of tabs.

An electron source without a plurality of tabs may have the same source of energy for mechanical vibrations as an electron source with a plurality of tabs. Therefore, the energy of oscillation of filament emitting tip 501 (which is stabilized by plurality of tabs 537) during oscillation may be the same as the energy of oscillation of a filament emitting tip without a plurality of tabs during oscillation. Accordingly, Equation (3) may describe the relationship of amplitude and spring constant between these two electron source configurations. As described above, the natural frequency of filament emitting tip 501, $\omega_2$, is greater than the natural frequency of a filament emitting tip without plurality of tabs 537, $\omega_1$. Therefore, the amplitude (e.g., vibrations) of filament emitting tip 501 may be reduced compared to the amplitude of a filament emitting tip without plurality of tabs 537, which may be described by the Equation (4) above.

In some embodiments, the length of filament emitting tip 501 or the filament prongs may be shorter than conventional configurations since filament emitting tip 501 does not need to rely on filament prongs for support. Therefore, the mass of filament emitting tip 501 may be reduced such that the natural frequency of filament emitting tip 501 may be increased, as described by Equation (1), and the amplitude of filament emitting tip 501 may be reduced, as described by Equation (4). In some embodiments, the reduced length of filament emitting tip 501 or filament prongs may result in resistive heating at a reduced electrical power.

In some embodiments, plurality of tabs 537 may advantageously stabilize filament emitting tip 501 while minimizing thermal contact between filament emitting tip 501 and the base (e.g., upper base portion 407*a* of FIG. 4, lower base portion 407*b* of FIG. 4) of electron source 500. In some embodiments, the minimization in thermal contact may advantageously allow filament emitting tip 501 to maintain sufficient resistive heating to emit one or more electrons.

By minimizing thermal contact between filament emitting tip 501 and the upper base portion and the lower base portion and minimizing vibrations of filament emitting tip 501, electron source 500 may advantageously provide higher quality samples and images (e.g., minimizing oscillations in gray scale levels in images, minimizing oscillations in gray scale levels at edges of sharp objects in images, minimizing oscillations in gray scale levels at lithographically-defined lines in images, minimizing inaccurate or varying gray scale levels across images, maximizing critical dimension stability, maintaining repeatability in samples and images, etc.).

FIG. 6 illustrates a schematic diagram of a top view of an exemplary electron source 600 that is part of the exemplary electron beam tool of FIG. 2, consistent with embodiments of the present disclosure. FIG. 6 may illustrate a schematic diagram of a top view of electron source 400 of FIG. 4 or a top view of electron source 500 of FIG. 5. Components of electron source 600 may be part of, or joined to, an upper base portion (e.g., upper base portion 407*a* of FIG. 4) of an electron source (e.g., electron source 400 of FIG. 4).

In some embodiments, the upper base portion (e.g., including plurality of tabs 637) of electron source 600 may be manufactured by drilling (e.g., laser drilling) a hole 627*a* (e.g., 100-200 μm in diameter, 250 μm depth with a conical taper at the bottom) in the upper base portion, where hole 627*a* may hold filament emitting tip 601. In some embodiments, plurality of tabs 637 may be manufactured by laser-machining hole 627*a* in the upper base portion. In some embodiments, plurality of tabs 637 may be manufactured to have a width 637*a* (e.g., less than or equal to 1 μm) so that the total contact area between filament emitting tip 601 and the base (e.g., upper base portion 407*a*, lower base portion 407*b* of FIG. 4) is minimized (e.g., 1500 μm²). In some embodiments, this configuration may minimize the heat transfer from filament emitting tip 601 to the base (e.g., including plurality of tabs 637). While FIG. 6 shows three tabs 637, it is appreciated that any number of tabs may be used.

For example, plurality of tabs 637 may be manufactured such that each tab extends from an inner side 627*c* of hole 627*a* toward a center of hole 627*a*. In some embodiments, filament emitting tip 601 may be positioned in the center of hole 627*a*.

In some embodiments, each tab of plurality of tabs 637 may be triangular shaped when viewed from above electron source 600. In some embodiments, each tab of plurality of tabs 637 may be substantially triangular shaped (e.g., some edges of each tab may be curved). In some embodiments, an apex 637*b* may be configured to contact filament emitting tip 601, thereby minimizing thermal contact between filament emitting tip 601 and the upper base portion.

The embodiments may further be described using the following clauses:

1. An electron beam system comprising:

an electron source comprising:

an emitting tip electrically connected to two electrodes and configured to emit an electron; and a base coupled to the emitting tip, wherein the base is configured to stabilize the emitting tip via the coupling.

2. The system of clause 1, wherein the emitting tip comprises tungsten.

3. The system of any one of clauses 1-2, wherein the base comprises a non-conductive material.

4. The system of clause 3, wherein the non-conductive material is ceramic.

5. The system of any one of clauses 1-4, wherein the base comprises a plurality of tabs configured to contact the emitting tip.

6. The system of clause 5, wherein the base comprises a holder configured to hold the plurality of tabs in contact with the emitting tip.

7. The system of any one of clauses 5-6, wherein each tab of the plurality of tabs is triangular shaped when viewed from above the plurality of tabs.

8. The system of clause 7, wherein an apex of each triangular-shaped tab of the plurality of tabs is configured to contact the emitting tip.

9. The system of any one of clauses 5-6, wherein each tab of the plurality of tabs is quadrilateral shaped when viewed from above the plurality of tabs.

10. The system of clause 9, wherein a shortest edge of each quadrilateral-shaped tab of the plurality of tabs is configured to contact the emitting tip.

11. The system of any one of clauses 5-10, wherein a base of each tab of the plurality of tabs extends away from the emitting tip.

12. The system of clause 11, wherein a cross-sectional area of the base of each tab of the plurality of tabs is greater than a cross-sectional area of a portion of the tab that contacts the emitting tip.

13. The system of any one of clauses 5-12, wherein the base comprises a hole and each tab of the plurality of tabs extends toward a center of the hole.

14. The system of clause 13, wherein the emitting tip is configured to be positioned in the center of the hole.

15. An electron source comprising:

an emitting tip electrically connected to two electrodes and configured to emit an electron; and a base coupled to the emitting tip, wherein the base is configured to stabilize the emitting tip via the coupling.

16. The electron source of clause 15, wherein the emitting tip comprises tungsten.

17. The electron source of any one of clauses 15-16, wherein the base comprises a non-conductive material.

18. The electron source of clause 17, wherein the non-conductive material is ceramic.

19. The electron source of any one of clauses 15-18, wherein the base comprises a plurality of tabs configured to contact the emitting tip.

20. The electron source of clause 19, wherein the base comprises a holder configured to hold the tab in contact with the emitting tip.

21. The electron source of any one of clauses 19-20, wherein each tab of the plurality of tabs is triangular shaped when viewed from above the plurality of tabs.

22. The electron source of clause 21, wherein an apex of each triangular-shaped tab of the plurality of tabs is configured to contact the emitting tip.

23. The electron source of any one of clauses 19-20, wherein each tab of the plurality of tabs is quadrilateral shaped when viewed from above the plurality of tabs.

24. The electron source of clause 23, wherein a shortest edge of each quadrilateral-shaped tab of the plurality of tabs is configured to contact the emitting tip.

25. The electron source of any one of clauses 19-24, wherein a base of each tab of the plurality of tabs extends away from the emitting tip.

26. The electron source of clause 25, wherein a cross-sectional area of the base of each tab of the plurality of tabs is greater than a cross-sectional area of a portion of the tab that contacts the emitting tip. (FIG. 5)

27. The electron source of any one of clauses 19-26, wherein the base comprises a hole and each tab of the plurality of tabs extends toward a center of the hole.

28. The electron source of clause 27, wherein the emitting tip is configured to be positioned in the center of the hole.

29. The system of any one of clauses 1-14, wherein:

the electron source further comprises two filament prongs; and the emitting tip and the two filament prongs form a "W" shape.

30. The electron source of any one of clauses 15-28, further comprising two filament prongs, wherein the emitting tip and the two filament prongs form a "W" shape.

31. An electron beam system comprising:

an electron source comprising:

an emitting tip electrically connected to two electrodes and configured to emit an electron; and a base comprising:

a hole; and a plurality of extensions extending toward a center of the hole, wherein the plurality of extensions are coupled to the emitting tip, wherein the base is configured to stabilize the emitting tip via the coupling.

32. An electron beam system comprising:

an electron source comprising:

an emitting tip coupled to two filament prongs, wherein the emitting tip and the two filament prongs form a "W" shape, each filament prong of the two filament prongs is coupled to an electrode, and the emitting tip is configured to emit an electron; and a base coupled to the emitting tip, wherein the base is configured to stabilize the emitting tip via the coupling.

33. The system of clauses 5-14 or 29, wherein the stabilizing of the emitting tip enables reducing thermal contact between the emitting tip and the base via the plurality of tabs configured to contact the emitting tip.

34. The system of clause 33, wherein the thermal contact between the base and the emitting tip is reduced as compared to a thermal contact between a base and an emitting tip that excludes a plurality of tabs.

35. The system of any one of clauses 5-14, 29, or 33-34, wherein the stabilizing of the emitting tip enables increasing a spring constant of the emitting tip to reduce vibrations of the emitting tip by.

36. The system of clause 35, wherein the vibrations of the emitting tip are reduced as compared to an emitting tip that excludes a plurality of tabs.

37. The system of any one of clauses 35-36, wherein the base comprises a plurality of tabs and the spring constant of the emitting tip is increased via the plurality of tabs configured to contact the emitting tip.

38. The system of any one of clauses 35-37, wherein the spring constant of the emitting tip is increased as compared to a spring constant of an emitting tip that excludes a plurality of tabs.

It will be appreciated that the embodiments of the present disclosure are not limited to the exact construction that has been described above and illustrated in the accompanying drawings, and that various modifications and changes may be made without departing from the scope thereof.

The invention claimed is:

1. An electron beam system comprising:
an electron source comprising:
    an emitting tip electrically connected to two electrodes via filament prongs and configured to emit an electron; and
    a base comprising a holder configured to support a plurality of tabs, the plurality of tabs configured to contact to the emitting tip, wherein the plurality of tabs are configured to stabilize the emitting tip via the contact.

2. The system of claim 1, wherein the emitting tip comprises tungsten.

3. The system of claim 1, wherein the base comprises a non-conductive material.

4. The system of claim 3, wherein the non-conductive material is ceramic.

5. The system of claim 1, wherein the holder is configured to support a lower portion of the plurality of tabs, thereby maintaining contact between the plurality of tabs and the emitting tip.

6. The system of claim 1, wherein each tab of the plurality of tabs is triangular shaped when viewed from above the plurality of tabs.

7. The system of claim 6, wherein an apex of each triangular-shaped tab of the plurality of tabs is configured to contact the emitting tip.

8. The system of claim 1, wherein each tab of the plurality of tabs is quadrilateral shaped when viewed from above the plurality of tabs.

9. The system of claim 8, wherein a shortest edge of each quadrilateral-shaped tab of the plurality of tabs is configured to contact the emitting tip.

10. The system of claim 1, wherein a base of each tab of the plurality of tabs extends away from the emitting tip.

11. The system of claim 10, wherein a cross-sectional area of the base of each tab of the plurality of tabs is greater than a cross-sectional area of a portion of the tab that contacts the emitting tip.

12. The system of claim 1, wherein the base comprises a hole and each tab of the plurality of tabs extends toward a center of the hole.

13. The system of claim 12, wherein the emitting tip is configured to be positioned in the center of the hole.

14. An electron source comprising:
an emitting tip electrically connected to two electrodes via filament prongs and configured to emit an electron; and
a base comprising a holder configured to support a plurality of tabs, the plurality of tabs configured to contact the emitting tip, wherein the plurality of tabs are configured to stabilize the emitting tip via the contact.

15. The electron source of claim 14, wherein the emitting tip comprises tungsten.

16. The electron source of claim 14, wherein the base comprises a non-conductive material.

17. The electron source of claim 16, wherein the non-conductive material is ceramic.

18. The electron source of claim 14, wherein the holder is configured to support a lower portion of the plurality of tabs, thereby maintaining contact between the plurality of tabs and the emitting tip.

* * * * *